United States Patent [19]
Caldwell et al.

[11] Patent Number: 4,575,744
[45] Date of Patent: Mar. 11, 1986

[54] INTERCONNECTION OF ELEMENTS ON INTEGRATED CIRCUIT SUBSTRATE

[75] Inventors: Luther B. Caldwell, Charlotte, N.C.; Michael F. Crocetti, Lexington, Ky.; Bradford Dunham, White Plains, N.Y.

[73] Assignee: International Business Machines Corporation, Armonk, N.Y.

[21] Appl. No.: 533,383

[22] Filed: Sep. 16, 1983

[51] Int. Cl.[4] ............... H01L 27/10; H01L 23/52; H01L 29/52
[52] U.S. Cl. .............................. 357/45; 357/40; 357/68; 357/71
[58] Field of Search ............... 357/45, 71, 68, 40

[56] References Cited
U.S. PATENT DOCUMENTS

| | | | |
|---|---|---|---|
| 3,199,002 | 8/1965 | Martin, Jr. | 357/40 |
| 3,751,720 | 8/1973 | Nestork | 357/68 |
| 3,795,845 | 3/1974 | Cass et al. | 357/68 |
| 3,808,475 | 4/1974 | Buelow et al. | 357/48 |
| 4,295,149 | 10/1981 | Balyoz et al. | 357/45 |

OTHER PUBLICATIONS

*IBM Technical Disclosure Bulletin* entitled "Bay Structure for Logic Chips," by K. R. King, vol. 18, No. 5, Oct. 1975, at p. 1510.

Primary Examiner—William D. Larkins
Assistant Examiner—E. Fallick
Attorney, Agent, or Firm—John A. Brady

[57] ABSTRACT

Concentric patterns of cells or macros (1) and conductive lines 13 conserve space on a substrate having two conductive levels. Macros (1) occupy only the first metal level and lines 13 are on the second metal level. The second metal level may also contain concentric patterns of power buses 20 and ground buses 20.

24 Claims, 11 Drawing Figures

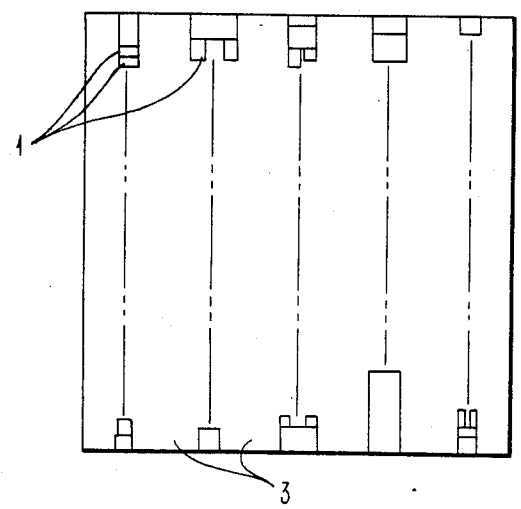
FIG. 1
PRIOR ART
FIG. 2
PRIOR ART
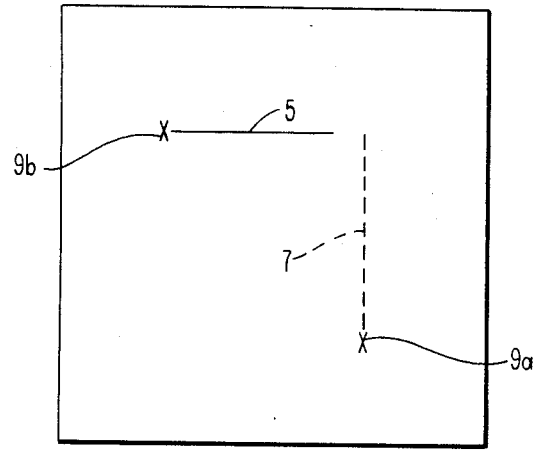
FIG. 3
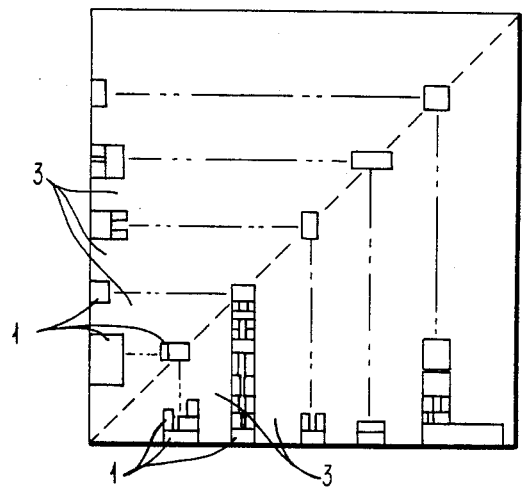

INTERCONNECTION OF ELEMENTS ON INTEGRATED CIRCUIT SUBSTRATE

DESCRIPTION

1. Technical Field

This invention is related to the design and configuration of integrated circuits. Integrated circuits now have a vast number of elements, including active circuit devices and passive circuit impedances, fashioned on the same substrate. Generally, these elements are clustered into functional groups, for example, amplifiers, memory drivers, registers and other functional sub-circuits. This invention is directed to the manner of interconnecting these sub-circuits efficiently on the semiconductor substrate to achieve high circuit density. The technology involved is that of the kind which has two levels on which conductive lines are fabricated. One of those levels will also contain and be blocked by the active and passive elements, while the other will be at a different level not conflicting with those elements. This invention also describes a configuration for applying operating potentials to circuits laid out with interconnections as described.

2. Background Art

U.S. Pat. No. 3,751,720 to Nestork shows a circular pattern on such a circuit substrate, but with essentially a single conductive level. U. S. Pat. 3,199,002 to Martin, Jr. shows interconnection using two levels with lines having no concentric or other pattern similar to this invention. U.S. Pat. No. 4,295,149 to Balyoz et al and *IBM Technical Disclosure Bulletin* article by K. R. King entitled "Bay Structure For Logic Chips," Vol. 18., No. 5, October 1975, at p. 1510, show ground and operating voltage lines in configurations generally similar to the concentric ground and operating voltage lines as disclosed and claimed in this application.

BACKGROUND DISCUSSION

"Cell" is a term used in the art to describe a circuit configuration which is self-contained and fixed in design. The term cell should be understood as defining a sub-circuit which is densely packed and which therefore does not provide for conductive lines to pass through the circuit or provides only very limited line-pass-through capability. These sub-circuits range from simple AND or OR logic circuits and the like to considerably larger groupings.

"Macro" is a term recently becoming used in the art to describe cells of particularly large and generally sophisticated sub-circuits. A macro may be relatively small, such as a data serializer-deserializer, or may be very large such as a memory bank having thousands of memory sites. Each such sub-circuit is a macro when its design is physically so compact as to not provide for conductive lines from another sub-circuit to pass through the circuit, or to provide only a very limited path for crossing conductive lines.

Macro circuits, of course, do provide terminals, generally at their periphery, to receive conductive lines from other circuits. These conductive lines integrate the macro with other circuitry on the substrate. Operatively interconnected macros on the same semiconductor substrate constitute a completed "chip."

Macros are now standard in the art and are of great economic significance since they constitute optimized, efficient designs of functional elements which may be readily combined without change with other macros to make sophisticated devices. Great attention and effort can be applied to perfect the design of each macro, with emphasis on packing the circuit elements together as densely as possible. This design may be used in any number of different chips and may be reproduced by standard integrated-circuit-fabrication techniques. The design may be efficiently replicated perhaps thousands of times on a single chip.

Cells must be separated on the chip so as to leave space for lines interconnecting the cells. The conventional configuration of cells on the chip is an ordered pattern leaving columns in which interconnecting lines may be positioned. Where all cells are substantially the same size, that interconnecting configuration may be relatively efficient.

"Master slice" or "gate array" is commonly used alternative technology for a configuration of columns of cells of all the same size. "Master image" is commonly used terminology for a configuration of cells similar to master slice except the cells vary in height and the columns vary in width, although each column is assigned a uniform width. Because of the constraints on the width of the columns, the master slice and master image cells typically are relatively small sub-circuits such as AND and OR logic blocks. No conductive pass through is typically provided since the cell boundaries are contiguous and cross paths are not provided within the cells. Although this invention has major utility where the cells are macros, typical master slice and master image configurations can employ this invention to advantage.

The fabrication of integrated circuits on a substrate involves the treatment of a starting substrate by different steps at different levels. These levels are physically spaced from one another and are generally parallel, although not strictly so. Accordingly, the levels do not necessarily interconnect electrically and levels which are to be connected electrically are typically interconnected using a via, which is a connective path perpendicular to the two levels being connected. Such fabrication techniques are entirely standard and state-of-the-art. This invention employs such state-of-the-art fabrication in patterns as will be described to achieve interconnection of the cells.

As will be immediately understood by those familiar with the integrated circuit fabrication art, the number of levels and the type of activation at each level to achieve conductivity or to achieve a transistor barrier or to fabricate a transistor is a matter of initial design choice which may vary greatly. Similarly, the number of levels is a matter of choice and depends upon the initial choice of the circuit designer. A large investment in capital equipment is effected to manufacture large numbers of integrated circuits employing the technology selected. Accordingly, after the initial selection of technology, including the number of levels and the type of treatment at different levels, the technology selected will constitute a constraint which must be followed in order to achieve mass production using the equipment assembled to carry out the mass production.

This invention is not limited by the type of technology involved, although where the interconnection of cells is concerned, it is directed to that technology which has two conductive levels. Typically the conductive material is metal. A conductive level in such technology is a level at which the processing step includes the capability of applying metal or the essential equivalent as highly conductive lines from one point to another on the circuit substrate. These conductive lines are the interconnections between cells, equivalent to wires connecting resistors, transistors, vacuum tubes and reactive impedances and other elements in large-scale, non-integrated circuits, Normally, the cells will occupy one of the two metal levels along with whatever metal lines are applied to that metal level. This avoids the necessity for a via to reach each macro from a metal level. The second metal level will physically clear the cells and, of course, the metal on the first metal level. (Typically, the technology will include a polysilicon level, which is used for certain connections, but is electrically inferior to the metal levels and therefore not used for long interconnections of cells.)

DISCLOSURE OF THE INVENTION

In accordance with this invention, a lay-out of conductive connections is provided to conserve space on a substrate having two conductive levels. The invention is particularly useful for chips having macros of varying sizes. Such macros typically occupy up to 80% of one metal conductive level (M1). In accordance with this invention, connecting lines on the second metal level (M2) are positioned in a rotary, concentric pattern, specifically having right-angle turns or bends at diagonals of the substrate. Connection between macros or cells include connection on M1 to a near available line on M1 but are primarily on M2. This significantly reduces the requirement for connection line space on M1 and the required substrate size is reduced accordingly. The lines of cells or macros are in concentric patterns so as to be optimally positioned with respect to the M2 conductive lines.

This application also describes and claims a rotary, concentric pattern of lines for connection of operating voltage and ground, thereby providing a pattern which is concentric with the connecting line laid out in accordance with the foregoing. The configuration is a substantially closed pattern around the center.

BRIEF DESCRIPTION OF THE DRAWING

The details of this invention will be described in connection with the accompanying drawings in which:

FIG. 1 illustrates the conventional positioning of macros on a substrate.

FIG. 2 illustrates a conventional interconnection between two points.

FIG. 3 illustrates a bent-column configuration in accordance with this invention.

BEST MODE FOR CARRYING OUT THE INVENTION

Figure 4:
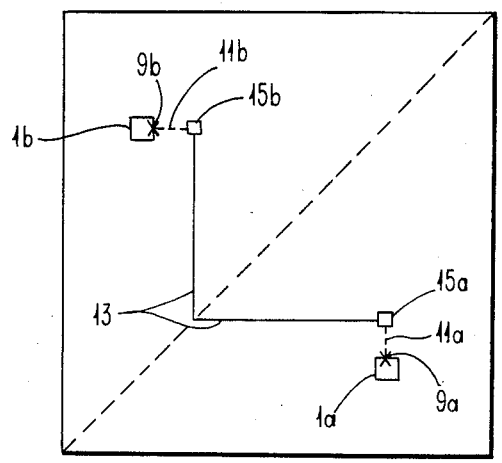
FIG. 4 illustrates an interconnection with a bent-column configuration.

In all of the figures, the small rectangles each represent a macro. The usual array of macros 1 on an integrated substrate usually is in parallel columns having parallel open spaces or streets 3 between the columns as shown in FIG. 1. The streets 3 have to be sufficiently wide to accommodate all of the wires which are to pass down the streets 3. As the macros 1 and the wires in the streets 3 occupy the same metal level, the combination of the two demand space adequate for each.

Wires in the metal level containing the streets (M1) can only run parallel to the streets unless an across-path is provided. Typically, the macros are so densely packed as to not provide for any wires to be laid out on M1 perpendicular to the streets. Interconnections in that direction are to be in the second metal level, M2. The connection from the first metal level to the second metal level is by a standard via. Some macros have a cross-connection path as part of their design, but such a path provides only very limited connection capabilities.

Thus, a connection between two points in this prior art is as shown in FIG. 2. The M2 level contains the horizontal lines or wires 5 shown as full lines in the drawing. The M1 level contains macros 1 (FIG. 1) and the vertical lines or wires 7 (FIG. 2) in streets 3 as discussed, the vertical lines being shown as dotted lines in the drawing.

To connect the two crossed points 9a and 9b shown in FIG. 2, various routings are possible. For any routing, however, assuming all vertical lines 7 are on the M1 level and all horizontal lines 5 are on the M2 level, the length of horizontal wire lines 5 necessary to make the connection cannot be less than the amount indicated in FIG. 2. Similarly, the length of vertical wire or lines 7 necessary to make the connection cannot be less than the amount indicated in FIG. 2. Often congested regions will occur on one metal level or the other.

This invention provides the option of primarily using either vertical wire or horizontal wire as desired. Horizontal wire can be effectively substituted with vertical wire and vice versa as it suits the purposes of a particular design. As considerably less space is available on the M1 level, favoring the M2 level can significantly reduce the overall size of the substrate of any final design.

A bent-column configuration in accordance with this invention is shown in FIG. 3. FIG. 3 shows macros 1 as they are positioned in an overall approach to circuit design. The content of each macro 1 and the exact configuration is immaterial to this invention and will vary depending upon the actual form and content of the circuit being designed. Typically, the macros 1 are generally rectangular and most are roughly similar in size. Exceptionally large macros 1 are typically located near the boundary rather than toward the center, where they may extend across a significant part of a street 3.

As shown in FIG. 3, macros 1 are closely packed so as not to provide for conductive wires crossing the macros 1, but the macros are positioned in parallel lines having a 90° bend, while the lines of contiguous macros 1 themselves are generally concentric. Specifically with respect to FIG. 3, macros 1 are parallel lines which are vertical up to a diagonal of the square substrate shown and horizontal from that point.

Macros 1 are otherwise in accordance with standard circuit techniques and therefore occupy the M1 level as previously described. Accordingly, the M1 wiring will appear in streets 3 between the macros 1 and will be parallel to the lines of macros 1. As distinguished from the FIG. 2 configuration, the M1 wiring in accordance with this invention also has a 90° bend in it and is generally concentric. Wiring in the M2 level is perpendicular to wiring in the M1 level spaced from it and, accordingly, also is concentric.

Interconnections showing the use of the bent configuration in accordance with this invention are shown in FIG. 4. Lines or wires 11a and 11b in the M1 plane are shown dotted and wires 13 in the M2 plane are shown as solid lines. Once again, two points 9a and 9b, denoted by crosses, are to be interconnected. The prior-art interconnection of points 9a and 9b, as shown in FIG. 2 is roughly one-half by a street 3 and would therefore require corresponding room to be left in the M1 level for both the interconnection and the macros 1. In accordance with this invention, however, a choice is provided as to what level to use. Line 13 in the M2 level are primarily used, while short connecting lines 11a and 11b on M1 are employed. It is apparent from FIG. 4 that the great majority of the wire for the routing in FIG. 4 is in the M2 level.

More specifically, as shown in FIG. 4, point 9a is a connection to macro 1a. Wire 11a on the M1 level is only from the macro 1a to a point corresponding to a perpendicular wire 13 on the M2 plane. Connection of wire 13 is by a via 15a to the M2 plane and the great majority of the wiring is then on the M2 plane. At the other end of wire 13 a via 15b connects to line 11b on M1, which is perpendicular to line 13. Line 11b is the shortest distance from line 13 to point 9b, a connection to macro 1b.

Nevertheless, had the particular macro 1 to be interconnected been positioned so that wiring primarily using a street 3 was desirable, streets 3 are available even though bent rather than entirely straight as has been conventional. Accordingly, no capability is lost in accordance with this invention and the option to select routing offers a valuable tool in designing a more compact circuit arrangement.

Figure 5:
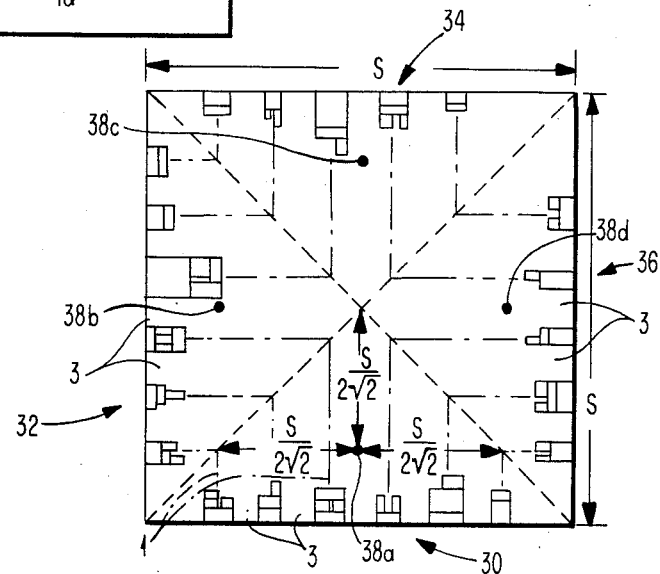
FIG. 5 illustrates a configuration with four bent points.

It should be understood that the basic concepts of this invention do not require only a single bending point. For example, see the four part pattern of FIG. 5. The substrate having macros 1 in FIG. 5 is rectangular, specifically shown as a square. The columns of macros 1 in FIG. 5 bend at points corresponding to the two diagonals. This provides a wide choice as to what metal level might provide a closer interconnection of macros 1. This configuration comprises four groups of bent column macros 1, each corresponding to a single group as illustrated in FIG. 3. The four in FIG. 5 define separate equal parts of the overall square.

Figure 6:
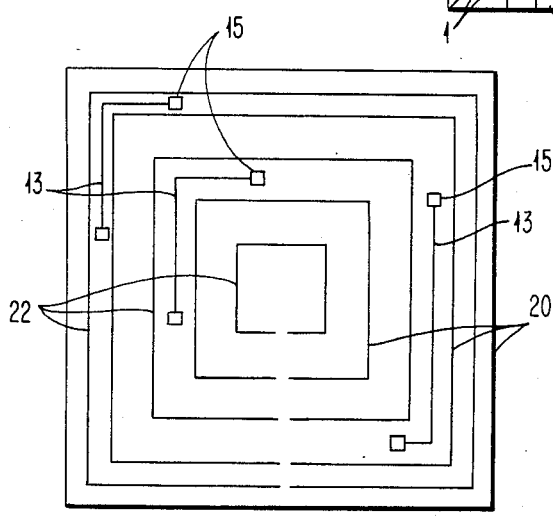
FIG. 6 shows a configuration of lines to supply operating voltage.
Figure 7:
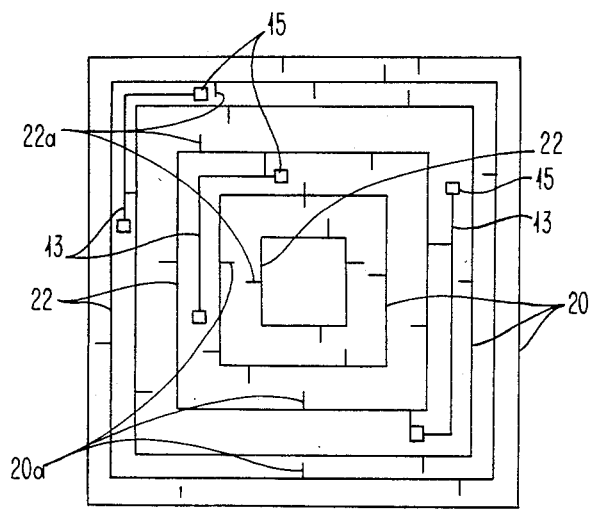
FIG. 7 shows the configuration of supply lines with perpendicular extensions.
Figure 8:
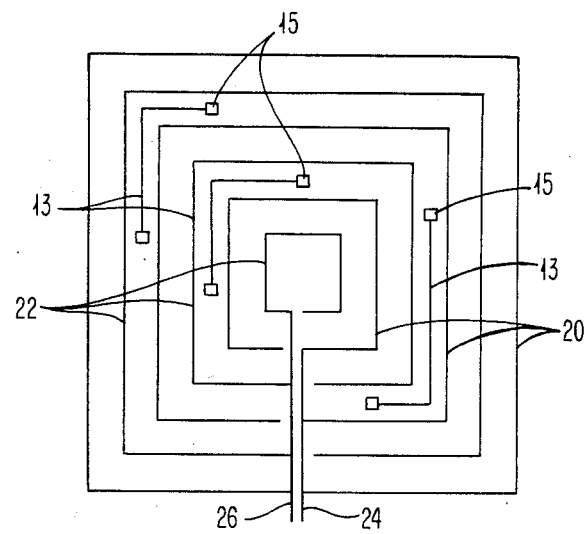
FIG. 8 shows one configuration of track lines to the voltage bases.

With the macros in a bent-column pattern as shown, for example, in FIG. 5, an improved design suited to supply operating voltage to the macros becomes a consideration. FIG. 6 shows a configuration of concentric squares by which the operating voltage and ground connections would be applied. These receive external power and reference potentials. The FIG. 6 configuration is that of concentric squares with power lines or buses 20 alternating with ground lines or buses 22. Buses 20 and 22 are on the M2 level. They are parallel and concentric to interconnecting lines 13 between macros 1. Accordingly, the concentric squares of FIG. 6 through FIG. 8 are to be used with the four bent-column pattern of FIG. 5. All of the figures show three lines 13 and their associated via 15 as illustrative of the concentric position of lines 13 between the buses 20 and 22. Lines 13 are those described in detail in the foregoing as interconnecting macros and typically are large in number and fill much or all of the available space. The space between the buses 20 and 22 need not be uniform, but instead conforms to the perceived optimum requirements of macros 1 surrounded by the buses 20 and 22. Macros 1 (FIG. 4) between each ground line 22 and each operating voltage line 20, are connected by vias to the nearest buses 20 and 22.

Further availability to the buses 20 and 22 can be achieved in accordance with the configuration shown in FIG. 7 in which perpendicular extensions 20a and 22a of both lines 20 and 22, respectively, are employed within the concentric configuration. Extensions 20a and 22a are on the M1 level and may be considered "feeder" buses. They are connected to the primary buses 20 and 22 by vias. Their number is dependent upon the demand for them, as primarily defined by the macros 1 used.

Figure 9:
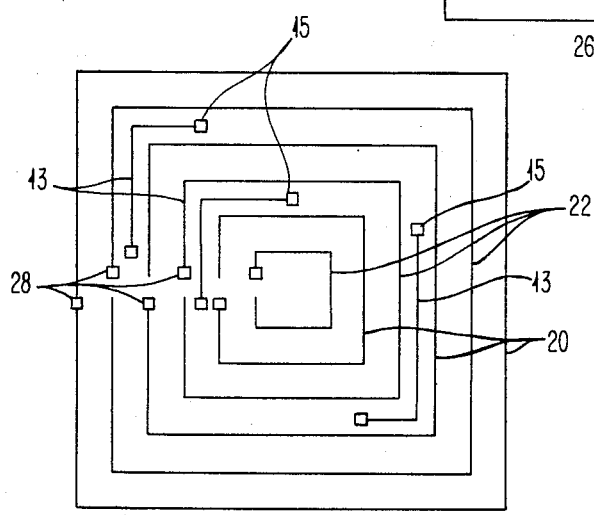
FIG. 9 illustrates a second connection of the voltage bases to external power.

The power bus 20 and ground bus 22 must connect conventionally to supplies from off the substrate. Such off-substrate connection can be implemented in at least two ways: First, as shown in FIG. 8, one power trunk 24 and one ground trunk 26 are positioned perpendicular to an edge of the chip on the M2 level. These two trunks can be positioned closely adjacent to one another in the center of one side of a substrate as shown in FIG. 8. In such a configuration, line 13 (FIG. 4) interconnecting macros 1 must be positioned so as not to cross trunks 24 or 26. The alternative approach shown in FIG. 9 avoids this problem. Each power bus 20 and ground bus 22 is connected to an individual pad 28, each pad 28 constituting a via to the surface of the chip. Pads 28 are supplied from sources external to the substrate. Each power bus 20 and ground bus 22 has an individual pad 28 and therefore is not interconnected with other buses 20 and 22, respectively, as are those in FIG. 8.

The concentric arrangement of power buses 20 and ground buses 22 satisfies the objective of keeping both buses totally on metal and at the same time exhibiting flexibility to handle all macros, in contrast with usual bus structure in which buses typically run all the way from top to bottom or all the way from left to right, depending on the level in which they occur. The concentric squares permits various geometric positions of the macros 1 and connecting wires 11 and 13 which would be excluded by the usual power bus arrangements. In particular, it permits bent-column configuration as described in the foregoing. Accordingly, the configuration of voltage buses as described is highly advantageous for various purposes and particularly suited for the bent-column arrangement of interconnections between macros 1 as described. Where more than one voltage levels are applied on different voltage buses, lines are interconnected concentrically in an extension of that shown here.

A theoretical maximum reduction in space requirements illustrates advantages of this invention and clarifies features which may be realized. Reference is made to FIG. 5, the active area containing macros 1 being square, with each side of length S. Each triangle 30, 32, 34, 36 formed by the diagonals of the square has a center of area, and therefore a representative point 38a, 38b, 38c, 38d, respectively, which is spaced from the apex a distance of $S/(2\cdot\sqrt{2})$ and is spaced from the side of the triangle a distance $S/(2\cdot\sqrt{2})$.

The center of area, for example 38a, is the central point in triangle 30 in which the area of the small triangle to the apex is equal to one-half of the total area. As the small angles are 45 degrees, the height in both triangles will be one-half the base. Accordingly, where X is the height of the small triangle from 38a to the apex:

$$\tfrac{1}{2} \cdot S \cdot (\tfrac{1}{2}S) = 2 \cdot \tfrac{1}{2} \cdot (2 \cdot X) \cdot X$$

$$\text{Solving: } X^2 = \frac{S^2}{8} \quad X = S/(2 \cdot \sqrt{2}\,)$$

For optimum design, a macro 1 in, for example, triangle 30, will be interconnected with a macro 1 in an adjoining triangle 32 or 36, but not with a macro 1 in an opposite triangle 34. Accordingly, the length of interconnection representative of the weighted average of all interconnections on M2 is from the representative point 38a in triangle 30 to the corresponding representative point 38b in adjoining triangle, 32 or point 38d in triangle 36. Interconnection is by the right angled lines 13 (FIG. 4) on M2. Accordingly, the distance is $S/(2\cdot\sqrt{2}) + S(2\cdot\sqrt{2})$, which equals $S/\sqrt{2}$ or 0.707S.

Assuming that lines on M2 are so closely packed that the length of lines on M1 employed just to come under a line on M2 is negligible, then the only significant lines on M1 are those directly necessary to connect macros 1 separated along the direction of streets 3. The average street 3 in the FIG. 5 configuration is one-half the length of streets of the conventional configuration of FIG. 1. Where two points may appear anywhere along streets 3, the representative location for each point is one-third from the end. Accordingly, the length representative of all interconnections entirely across the square is ⅓S. With the bent columns, the average column is ½S. The weighted average of all interconnections on M1 is therefore ⅓·½·S, which is 0.167S.

This compares favorably with the conventional configuration of FIG. 1 and FIG. 2 in which the representative connection on both M2 and M1 must be 0.333S.

Assuming full use of M1 and M2 in accordance with this invention, then:

Where:
Achip = Total Substrate Area
AM2 = Total M2 Level Area
AM1 = Total M1 Level Area
AMA = Total Macro Area
Mden = Macro Density
K = Constant Factor Related to The Minimum Required Spacing Between Conductive Lines Achip = AM2 = AM1 + AMA Rearranging: AMA = AM2 − AM1
Dividing both sides by Achip and recognizing AMA/Achip as Mden, AMA/Achip = (AM2−AM1)/Achip = Mden Inserting the foregoing weighted average values:

Mden = (0.707SK−0.167SK)/(0.707SK) = 0.764

Accordingly, the theoretical optimum density for macros for substrates of square active area is 76.4%.

Achip for the bent-column configuration can be shown quantitively to be less than the corresponding total substrate area for a conventional configuration.

Thus, AMA = AM2−AM1

Inserting the foregoing weighted average values for the bent-column configuration:

AMA (bent-column) = 0.707SK − 0.167SK = 0.54SK
and

Achip (bent-column) = AMA + AM1 = 0.54SK + 0.167SK = 0.707SK

Where the configuration is conventional, also,

Achip (conventional) = AMA + AM1

Assuming the same AMA as in the bent-column configuration

Achip (conventional) = 0.54S + 0.333S = 0.873S

Density on the conventional chip is therefore 0.54S/0.873S = 0.619 or 61.9%. Density of the bent-column density, as computed above, is 76.4%. The active area of the conventional chip thus is 1.235 times larger than that of the active area with the bent-column.

In a practical case, moreover, M1 cannot be fully used. A thinning of wires running perpendicular and near to an edge almost always is necessary. The M2 does not experience this. Hence, in actual design, a greater difference in size can be expected. Other space requirements on M1 ignored in the theoretical calculations, when considered, tend to still further similarly favor this invention.

Figure 10:
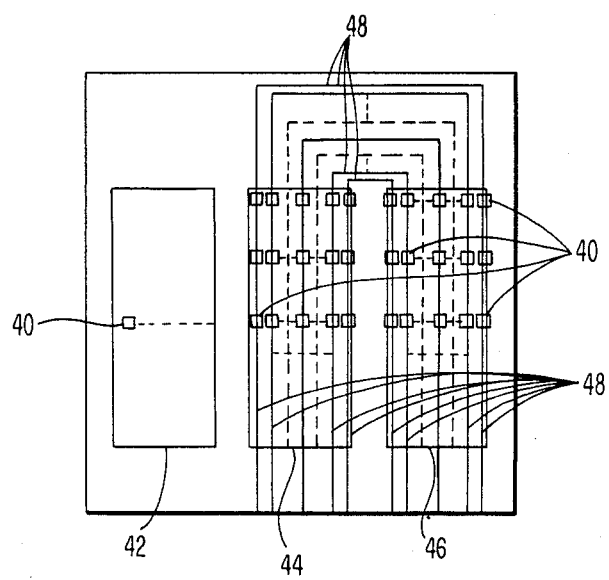
FIG. 10 illustrated an extended data bus of the prior art.

The bent column configuration is inherently suited for extensions of parallel registers on single buses without sharp corners or discontinuities in the buses. FIG. 10 shows the problem of a typical prior chip. Cells 40 constitute single bit registers within each column 42, 44 and 46. Cells 40 in columns 44 and 46 are connected by lines 48. A typical number of cells 40 across each column 42, 44 or 46 is 32. Accordingly, lines 48 are 32 in number, each associated with one cell 40 across each column 42, 44, 46. Lines 48 thereby constitute a 32 bit bus communicating with cells 40.

The number of 32 bit cells 40 across the columns 42, 44 and 46 may be very large, often exceeding the number of one column in the chip. For example, as shown in FIG. 10, lines 48 must traverse column 44 and then traverse column 46. The 90 degree turns shown in FIG. 10 illustrate that such a reversal consumes important space.

Figure 11:
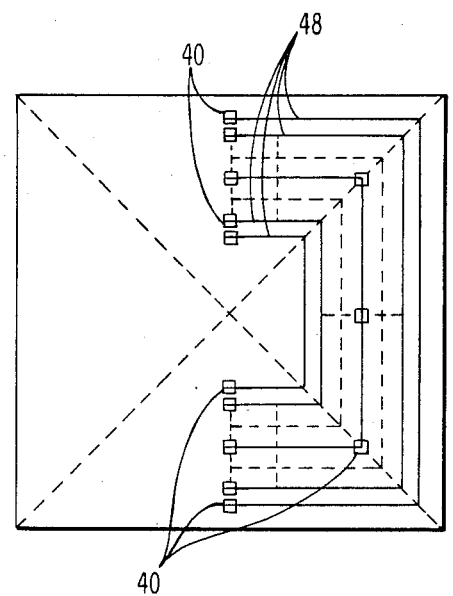
FIG. 11 illustrates an extended data bus in accordance with this invention.

FIG. 11 shows the same registers with the regular four part bent configuration of FIG. 5. Like elements are numbered the same as FIG. 10. No separate space is required to achieve the length of lines 48 to cells 40 in 32 bit columns which can extend almost completely around the active area of the chip.

Any placement selections which favor M2 over M1 with the conventional configuration are generally equally available with this invention. In fact, the connection to a different level is more readily available with this invention. Performance characteristics can also be enhanced by the more direct connections which are available from the choice of levels made possible by this invention.

It will be recognized that this invention has general applicability to circuit design and is not limited to any specific cell form or transistor technique or exact configuration. Accordingly, patent coverage should not be limited by the specifics described but should be within as broad a spirit and scope of the inventive contribution here and described. Particular emphasis is made to the accompanying claims.

We claim:

1. A solid state integrated circuit having circuit elements in adjoining cells and first and second spaced levels of conductive lines formed on said integrated circuit for interconnecting said cells, and said cells being primarily interconnected by generally concentric conductive lines on said second level which have at least one turn and by generally straight conductive lines on said first level connected to said conductive lines on said second level.

2. The integrated circuit as in claim 1 in which said adjoining cells are macro circuit elements.

3. The integrated circuit as in claim 1 in which said adjoining cells form two substantially straight columns joined at a substantially right angle bend.

4. The integrated circuit as in claim 2 in which said adjoining macro circuit element form two substantially straight columns joined at a substantially right angle bend.

5. The integrated circuit as in claim 3 comprising four groups of said columns, each group defining one of four equal parts of a rectangle, with said bends located substantially on the diagonals of said rectangle.

6. The integrated circuit as in claim 4 comprising four groups of said columns, each group defining one of four equal parts of a rectangle, with said bends located substantially on the diagonals of said rectangle.

7. The integrated circuit as in claim 1 in which said second level also comprises a plurality of power buses and a plurality of ground buses, said power buses and said ground buses being generally concentric with themselves and with said conductive lines on said second level interconnecting said cells.

8. The integrated circuit as in claim 2 in which said second level also comprises a plurality of power buses and a plurality of ground buses, said power buses and said ground buses being generally concentric with themselves and with said conductive lines on said second level interconnecting said cells.

9. The integrated circuit as in claim 3 in which said second level also comprises a plurality of power buses and a plurality of ground buses, said power buses and said ground buses being generally concentric with themselves and with said conductive lines on said second level interconnecting said cells.

10. The integrated circuit as in claim 4 in which said second level also comprises a plurality of power buses and a plurality of ground buses, said power buses and said ground buses being generally concentric with themselves and with said conductive lines on said second level interconnecting said cells.

11. The integrated circuit as in claim 5 in which said second level also comprises a plurality of power buses and a plurality of ground buses, said power buses and said ground buses each surrounding a central point and being generally concentric with themselves and with said conductive lines on said second level interconnecting said cells.

12. The integrated circuit as in claim 6 in which said second level also comprises a plurality of power buses and a plurality of ground buses, said power buses and said ground buses each surrounding a central point and being generally concentric with themselves and with said conductive lines on said second level interconnecting said macro circuit elements.

13. A solid state integrated circuit having circuit elements in adjoining cells forming a plurality of substantially continuous lines, first and second spaced levels of conductive lines formed on said integrated circuit for interconnecting said cells, said lines of cells forming substantially straight columns joined at a bend with said straight columns being substantially parallel, said cells being interconnected by generally concentric conductive lines on said second level which have at least one turn and by generally straight conductive lines on said first level connected to said conductive lines on said second level.

14. The integrated circuit as in claim 13 in which adjoining cells are macros of substantially different sizes.

15. The integrated circuit as in claim 13 in which said adjoining cells form two substantially straight columns and said bend is substantially a right angle.

16. The integrated circuit as in claim 14 in which said adjoining cells form two substantially straight columns and said bend is substantially a right angle.

17. The integrated circuit as in claim 15 comprising four groups of said lines of adjoining cells having substantially parallel lines, each group defining one of four equal parts of a rectangle, with said bends of each group located substantially on the diagonals of said rectangle.

18. The integrated circuit as in claim 16 comprising four groups of said lines of adjoining macros having substantially parallel, columns, each group defining one of four equal parts of a rectangle, with said bends of each group located substantially on the diagonals of said rectangle.

19. The integrated circuit as in claim 13 in which said second level also comprises a plurality of power buses and a plurality of ground buses, said power buses and said ground buses being generally concentric with themselves and with said conductive lines on said second level interconnecting said cells.

20. The integrated circuit as in claim 14 in which said second level also comprises a plurality of power buses and a plurality of ground buses, said power buses and said ground buses being generally concentric with themselves and with said conductive lines on said second level interconnecting said cells.

21. The integrated circuit as in claim 15 in which said second level also comprises a plurality of power buses and a plurality of ground buses, said power buses and said ground buses being generally concentric with themselves and with said conductive lines on said second level interconnecting said cells.

22. The integrated circuit as in claim 16 in which said second level also comprises a plurality of power buses and a plurality of ground buses, said power buses and said ground buses being generally concentric with themselves and with said conductive lines on said second level interconnecting said cells.

23. The integrated circuit as in claim 17 in which said second level also comprises a plurality of power buses and a plurality of ground buses, said power buses and said ground buses each surrounding a central point and being generally concentric with themselves and with said conductive lines on said second level interconnecting said cells.

24. The integrated circuit as in claim 18 in which said second level also comprises a plurality of power buses and a plurality of ground buses, said power buses and said ground buses being generally concentric with themselves and with said conductive lines on second level interconnecting said macros.

* * * * *